United States Patent [19]

Schulz et al.

[11] Patent Number: 5,200,293
[45] Date of Patent: Apr. 6, 1993

[54] PHOTORESIST COMPOSITION CONTAINING SPECIFIC AMOUNTS OF A NAPHTHOQUINONE DIAZIDE SULFONYL ESTER OF TETRAHYDROXY DIPHENYL SULFIDE AND A POLYHYDROXY COMPOUND

[75] Inventors: Reinhard Schulz, Reinheim; Horst Münzel, Reutlingen; Ekkehard Bartmann, Erzhausen, all of Fed. Rep. of Germany

[73] Assignee: Ciba-Geigy Corporation, Ardsley, N.Y.

[21] Appl. No.: 793,494

[22] Filed: Nov. 14, 1991

Related U.S. Application Data

[63] Continuation of Ser. No. 481,525, Feb. 16, 1990, abandoned.

[30] Foreign Application Priority Data

Feb. 23, 1989 [CH] Switzerland .................. 00655/89

[51] Int. Cl.$^5$ .......................... G03F 7/23; G03F 7/32
[52] U.S. Cl. .................................. 430/191; 430/165; 430/192; 430/193; 430/326
[58] Field of Search ............. 430/191, 192, 193, 165, 430/166, 326

[56] References Cited

U.S. PATENT DOCUMENTS 3,184,310 5/1965 Fritz et al. ...................... 430/193

(List continued on next page.)

FOREIGN PATENT DOCUMENTS 0001254 4/1979 European Pat. Off. .
0055814 7/1982 European Pat. Off. .
0301332 7/1989 European Pat. Off. .

OTHER PUBLICATIONS

Abst. for EP301,332 (89-033252/05).

*Primary Examiner*—Charles L. Bowers, Jr.
*Assistant Examiner*—John S. Chu
*Attorney, Agent, or Firm*—Luther A. R. Hall; Harry Falber; William A. Teoli, Jr.

[57] ABSTRACT

Positive-working photoresist compositions containing 23-27%, based on said composition, of at least one compound of formula (I)

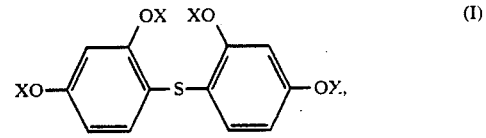

wherein one of the substituents X is hydrogen or a group of formula II

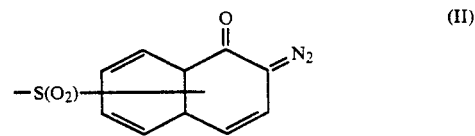

and the other substituents X are a group of formula II; and 6-11%, based on said composition, of at least one polyhydroxy compound of formula III

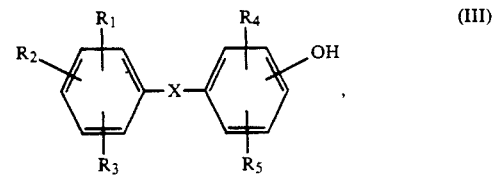

wherein X is a direct bond, —O—, —S—, —SO$_2$—, —CO— or C(R$_6$(R$_7$)—, and R$_1$, R$_2$, R$_3$, R$_4$ and R$_5$ are each independently of the other hydrogen, halogen, C$_1$-C$_4$alkyl, C$_1$-C$_4$alkoxy or hydroxy, and R$_6$ and R$_7$ are each independently of the other hydrogen, —CH$_3$ or —CF$_3$.

These compositions have particularly good profile contrast and exhibit insignificant fluctuations in line width.

12 Claims, No Drawings

U.S. PATENT DOCUMENTS

| | | |
|---|---|---|
| 4,266,000 | 5/1981 | Stahlhofen et al. |
| 4,275,139 | 6/1981 | Stahlhofen ............... 430/191 |
| 4,493,884 | 1/1985 | Nagano et al. ............ 430/191 |
| 4,555,469 | 11/1985 | Erdmann et al. |
| 4,626,492 | 12/1986 | Eilbeck ................... 430/191 |
| 4,738,915 | 4/1988 | Komine et al. ............ 430/191 |
| 4,837,121 | 6/1989 | Blakeney et al. .......... 430/191 |
| 4,863,827 | 9/1989 | Jain et al. ............... 430/191 |
| 4,889,788 | 12/1989 | Stahlhofen et al. ........ 430/191 |
| 5,077,173 | 12/1991 | Schulz et al. ............ 430/191 |
| 5,106,718 | 4/1992 | Bartmann et al. .......... 430/191 |

PHOTORESIST COMPOSITION CONTAINING SPECIFIC AMOUNTS OF A NAPHTHOQUINONE DIAZIDE SULFONYL ESTER OF TETRAHYDROXY DIPHENYL SULFIDE AND A POLYHYDROXY COMPOUND

This application is a continuation of application Ser. No. 481,525, filed Feb. 16, 1990, now abandoned.

The present invention relates to positive-working photoresist compositions containing a naphthoquinonediazidesulfonic acid ester and an aromatic polyhydroxy compound, to a process for producing positive images, and to the use of said compositions as positive-working litho varnishes and in microlithography for producing integrated circuits.

Positive-working photoresists containing sensitisers which are obtained by mono-, di- or triesterifying a low molecular phenol with 1,2-naphthoquinone-2-diazide-5-sulfonyl chloride are disclosed in U.S. Pat. No. 4,626,492. These compositions additionally contain a dye and a trihydroxybenzophenone.

While these photoresist compositions have good sensitivity, they do not satisfy the requirements which are made of high-resolution photoresist materials at the present time in respect of quality (contrast) of the resist profiles, of the resolution and of the change in the width of the resist lines when the exposure energy is changed.

It is the object of the present invention to provide a positive-working photoresist composition which is distinguished in particular by good profile contrast and minimum fluctuation in line width. Such a composition shall, of course, also have good sensitivity and temperature resistance.

Accordingly, the present invention relates to a positive-working photoresist composition containing 23–27%, based on said composition, of at least one compound of formula (I)

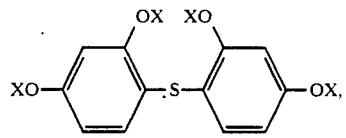

wherein one of the substituents X is hydrogen or a group of formula II

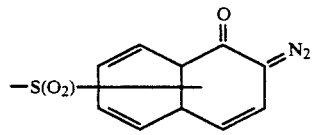

and the other substituents X are a group of formula II; and 6–11%, based on said composition, of at least one polyhydroxy compound of formula III

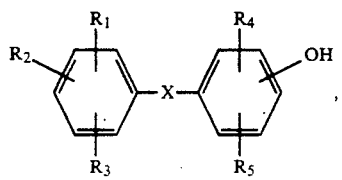

wherein X is a direct bond, —O—, —S—, —SO$_2$—, —CO— or C(R$_6$(R$_7$)—, and R$_1$, R$_2$, R$_3$, R$_4$ and R$_5$ are each independently of the other hydrogen, C$_1$–C$_4$alkyl, C$_1$–C$_4$alkoxy or hydroxy, and R$_6$ and R$_7$ are each independently of the other hydrogen, —CH$_3$ or —CF$_3$.

The compounds of formula I are known and disclosed, for example, in German Auslegeschrift 1 118 606. These light-sensitive esters are prepared in a manner known per se, for example by reacting in particular the sulfonyl chlorides of 1,2-naphthoquinonediazide sulfonic acids with 2,4,2',4'-tetrahydroxy diphenyl sulfide. Particularly suitable esters of 1,2-naphthoquinonediazide sulfonic acid are those which are derived from 1,2-naphthoquinone-2-diazide-4-sulfonic acid and, preferably, from 1,2-naphthoquinone-2-diazide-5-sulfonic acid. To prepare the esters, the two components (the sulfonic acids being generally used as the sulfonyl chloride) are usually dissolved in a solvent such as dioxane, tetrahydrofuran, dimethyl formamide, diethylene glycol dimethyl ether or glycol monomethyl ether, and esterified by addition of a weak alkali such as an alkali metal hydrogencarbonate, an alkali metal carbonate or an amino compound, for example triethylamine. The resultant sulfonic acid esters may be used immediately in the photoresist compositions or purified in a manner known per se, for example in a suitable solvent such as dioxane, and reprecipitated by subsequent addition of water. By choosing suitable quantities of the 1,2-naphthoquinonediazide sulfonyl chlorides it is possible to esterify three or all hydroxyl groups of the 2,4,2',4'-tetrahydroxy diphenyl sulfide. It is preferred to use about three moles of 1,2-naphthoquinonediazide sulfonyl chloride per mode of 2,4,2',4'-tetrahydroxy diphenyl sulfide.

The compounds of formula III are also known compounds and some are commercially available. Such aromatic polyhydroxy compounds are disclosed, for example, in German Offenlegungsschrift 3 724 791.

The compounds of formula III contain not less than two hydroxyl groups. The substituents R$_1$, R$_2$, R$_3$, R$_4$ and R$_5$, provided they are not hydrogen, may be halogen such as fluoro, chloro or bromo; C$_1$–C$_4$alkyl such as methyl, ethyl, n- or isopropyl, n-, sec- or tert-butyl, or C$_2$–C$_4$alkoxy such as methoxy, ethoxy, n-propoxy or isopropoxy; n-, sec- or tert-butoxy and also hydroxy.

The compounds of formula III preferably contain two or three hydroxyl groups and no other substituents. The hydroxyl groups are preferably in 4,4'-, 2,2'- or 2,3,4-position. Suitable compounds of formula III are 4,4'-dihydroxybiphenyl, 2,2'-dihydroxybiphenyl, 4,4'-dihydroxybenzophenone, bis(4-hydroxyphenyl) ether, bis(4-hydroxyphenyl)sulfide, bis(4-hydroxyphenyl)propane.

Particularly preferred compounds of formula III are the trihydroxybenzophenones disclosed, for example, in U.S. Pat. No. 4,626,492, viz. 2,4,4'-trihydroxybenzophenone or 2,4,6-trihydroxybenzophenone and, most preferably, 2,3,4-trihydroxybenzophenone.

It has been found that the amounts employed of compounds of formulae I and III are of great importance for the processability and quality of the photoresist material.

These amounts may vary only within narrow limits if the desired quality is to be attained. If these limits are not observed, then the contrast and fluctuation in line width will suffer in quality.

For the compounds of formula I these limits are in the range from 23–27% by weight, based on the entire photoresist composition, preferably from 24–26% by weight, and for the compounds of formula III are in the range from 6–11% by weight, preferably 6–10% by weight. In this connection, the percentages by weight are based on the total solids content of the composition.

The essential features of a photoresist for technical use are radiation sensitivity, image resolution and contrast. High sesitivity is important for ensuring brief exposure times in the production process cycles, even if, for example, only radiation of low intensity, for example in monochromatic exposure, is able to act on the resist on account of the apparatus employed.

The image resolution delineates up to what dimensions the smallest image structures of the master, such as lines and interspaces, can be reproduced clearly separated and accurately by the photoresist in the form of fine contours and indentations. The production of VLSI circuits requires the reproduction of structural details in the order of magnitude of 1 μm and less.

The contrast delineates the contrast and the contour definition of the photoresist relief structures after development. These should be as sharply contoured as possible and ideally have 90° flanks.

The resolution obtainable in the production of the photoresist structures primarily depends on the properties of the photoresist specific to the materials of which it is composed, such as in particular absorption and the quantum yield of the radiation that initiates the reaction, as well as on the development behaviour. The lower limit of the resolution is found in the optical quality of the exposure apparatus and theoretically from the wavelength of the radiation employed. Optical systems which are designed for the most exacting requirements for monochromatic exposure must have a high numerical aperture. With increasing numerical aperture, however, the depth of focus decreases and hence the latitude for focusing which is necessary for a utility under production conditions diminishes considerably. It is not possible to achieve higher resolutions by using radiation of lower wavelength, such as low UV or X-radiation, with the current positive photoresists on account of their photochemical properties and with conventional exposure devices which operates in the near UV range with radiation of the mercury spectrum. Thus there are practical limits to increasing resolution by optical means.

The current conventional positive photoresists on the basis of alkali-soluble resin and naphthoquinonediazide compounds make it possible to achieve a resolution down to as low as 0.8–0.9 μm when exposed in the near UV range with lenses having a numerical aperture of 0.3–0.4. Given the demand for increasingly higher integration density on microchips, there is consequently a considerable need for positive photoresists of higher resolution which are structurable in the near UV range and which can be processed in particular in the wafer steppers which are used on a large scale in mass production and which work chiefly monochromatically with the radiation of the mercury G line (436 nm). In the sub-micrometer range, an enhancement of resolution by 0.1–0.3 μm over the prior art is substantial. Hence it is a further object of the invention to improve positive photoresists of the prior art such that they have a markedly increased resolution in the near UV range and also give structures of excellent contour definition and contrast.

Photoresist compositions have been described in numerous publications, for example in DeForest, "Photoresist Materials and Processes", McGraw-Hill Book Company, N.Y., 1975. These comprise coatings prepared from a solution or coatings applied as dry film. The positive-working photoresist becomes soluble in the developer after exposure to activating radiation.

The positive-working photoresists consist substantially of a light-sensitive compound in a film-forming polymer binder. They may be physical mixtures or reaction products, so-called diazo resins. The most frequently used light-sensitive compounds or sensitisers have become known as quinonediazides. They are in particular esters and amides of o-quinonediazide carboxylic acids and, most particularly, o-quinonediazide sulfonic acids. Suitable sensitisers of this kind are described, for example, in DeForest (op. cit., pp. 47-5) and in the following U.S. Pat. Nos. 2,754,209, 3,046,110, 3,046,112, 3,046,113, 3,046,116, 3,046,118, 3,046,119, 3,046,120, 3,647,443, 3,759,711 and 4,141,733. Preferably these compounds are naphthoquinonediazides and, most preferably, o-naphthoquinone-4- or -5-sulfonic acid derivatives. The monomeric quinonediazide sulfonic acids are incorporated in the binder in the form of their esters or amides, or, for example, a quinonediazide sulfonyl chloride is reacted with the binder, as described in U.S. Pat. No. 4,141,733 or GB patent specification 1 546 633. The reaction products are called diazo resins.

The choice of binder will depend on the utility and the properties required therefor. A list of such resins will be found in DeForest (op. cit., pp. 57-59).

Exemplary of particularly suitable binders are novolaks which are derived from an aldehyde, preferably acetaldehyde or formaldehyde, but preferably from formaldehyde, and a phenol. The phenolic component of this binder is preferably phenol itself or also halogenated phenol, for example substituted by one or two chlorine atoms, preferably p-chlorophenol, or it is a phenol which is substituted by one to two $C_1$–$C_9$alkyl groups, for example o-, m- or p-cresol, a xylenol, p-tert-butylphenol or p-nonylphenol. The phenol component of the preferred novolaks can, however, also be p-phenylphenol, resorcinol, bis(4-hydroxyphenyl)methane or 2,2-bis(4-hydroxyphenyl)propane.

Some of the phenolic hydroxyl groups of these novolaks may be modified by reaction with, for example, chloroacetic acid, isocyanates, epoxides or carboxylic anhydrides.

Further suitable binders are typically polyvinylphenols or copolymers of maleic anhydride with styrene or vinyl ethers or 1-alkenes, or copolymers of hydroxystyrene or aminostyrene with styrene, vinyl acetate and the like.

It is also possible to use as binders copolymers of esters of acrylic acid or methacrylic acid with ethylenically unsaturated acids, for example methacrylic acid or acrylic acid.

The term "diazo resin" is used to denote binders which carry light-sensitive quinonediazide substituents. Such binders are therefore not physical mixtures of light-insensitive binders and light-sensitive compounds, but are light-sensitive binders which can be obtained by reacting a light-insensitive binder with a light-sensitive compound, especially a reactive quinonediazide, for example a o-naphthoquinonediazide sulfonyl chloride. Such diazo resins are disclosed, for example, in U.S. Pat. Nos. 3,046,120 and 4,141,733, in GB patent specifications 1 026 144 and 1 113 759, in German patent specifications 1 803 712 and 1 911 497, and in Canadian patent specification 903 545, and can be prepared by the methods described in these publications.

Particularly suitable for the reaction with a light-sensitive reactive quinonediazide, for example, with o-naphthoquinonediazide-4- or -5-sulfonyl chloride are phenol/formaldehyde or cresol/formaldehyde resins, polyvinyl phenols or aminostyrene or hydroxystyrene copolymers, for example with styrene, vinyl acetate and the like.

Yet further auxiliary resins may be added to these alkali-soluble binders, as is customary in positive-working systems. These auxiliary resins are typically vinyl polymers such as polyvinyl acetate, polyacrylates, poly(alkylmethacrylates) or poly(alkylacrylates), in which alkyl is $C_1$–$C_{20}$alkyl, polyvinyl ethers or polyvinyl pyrrolidones. Generally, however, not more than 20% by weight, based on the amount of alkali-soluble binder, of these auxiliary resins is added.

The compositions of this invention may contain further conventional modifiers such as stabilisers, pigments, dyes, fillers, adhesion promoters, levelling agents, wetting agents and plasticisers. For application, the compositions may also be dissolved in suitable solvents.

The compositions of this invention have excellent suitability as coating agents for substrates of all kinds, for example wood, textiles, paper, ceramics, glass, plastics materials such as polyesters, polyethylene terephthalates, polyolefins or cellulose acetate, preferably in the form of films, and also of metals such as Al, Cu, Ni, Fe, Zn, Mg or Co, and of Si or $SiO_2$, on which it is desired to produce an image by image-wise exposure. The invention further relates to the coated substrates.

The present invention also relates to a process for producing positive images comprising the following steps:

a) coating a substrate with a radiation-sensitive composition as defined above,
b) exposing the coated substrate to actinic radiation in a predetermined pattern, and
c) developing the exposed and coated substrate.

The preparation of the coated substrates can be effected, for example, by preparing a solution or suspension of the composition. The choice of solvent and the concentration depends mainly on the nature of the composition and on the coating method. The solution is uniformly applied to a substrate by known coating methods, for example by spin coating, immersion, doctor coating, curtain coating, brushing, spraying and reverse roller coating. It is also possible to apply the light-sensitive layer to a temporary flexible support and then to coat the final substrate, for example a copper-clad circuit board, by coat transfer by means of lamination.

The add-on (layer thickness) and the nature of the substrate are contingent on the desired utility. A particular advantage of the compositions of the invention is that they can be used in widely varying layer thicknesses.

Possible utilities of the compositions of this invention are as photoresists in the electronics field (galvanoresist, discharge resist), the production of printing plates such as offset plates for autotypical photogravure or for roller printing, and also for the production of screen printing formes, mould etching, or as microresist in the production of integrated circuits in microelectrinics.

The possible substrates and conditions for processing the coated substrates differ correspondingly.

Sheets made from polyester, cellulose acetate or plastics-coated papers are typically used for the photographic recording of information. Specially treated aluminium is used for offset formes; and copper-clad laminates are used for producing printed circuits.

After the substrate has been coated, the solvent is normally removed by drying to give a layer of photoresist on the substrate.

After image-wise exposure of the material in conventional manner, the exposed areas of the photoresist are washed out with a developer.

Particularly preferred developers are the aqueous-alkaline solutions used for the development of naphthoquinone diazide/novolak resists. These include in particular aqueous solutions of alkali metal silicates, phosphates and hydroxides, or tetraalkylammonium compounds. These solutions may additionally contain minor amounts of wetting agents and/or organic solvents and other additives.

Typical organic solvents are those which are miscible with water and can be added to the developer liquids, for example 2-ethoxyethanol or acetone, as well as mixtures of two or more such solvents.

The expression "exposure to actinic radiation in a predetermined pattern" will be understood to mean exposure through a photomask which contains a predetermined pattern, for example a chromium mask or a photographic transparency, as well as exposure to a laser beam which is moved by logic control over the surface of the coated surface to produce an image.

The light-sensitivity of the compositions of this invention extends generally from the UV region (ca. 250 nm) to ca. 600 nm and is thus very wide ranging. Suitable light sources therefore comprise a large number of very widely varying types. Point light sources as well as arrays of reflector lamps are suitable. Examples are: carbon arcs, xenon arcs, mercury vapour lamps which may be doped with halogen atoms (metal halide lamps), fluorescent lamps, argon glow lamps, electronic flash lamps and photographic flood lamps. The distance between lamp and image material may vary substantially, depending on the utility and the type of lamp, for example from 2 cm to 150 cm. Particularly suitable light sources are laser light sources, for example argon ion lasers or crypton ion lasers with strong emission lines (Ar lasers) at 457, 476, 488, 514, 528 nm. With this type of exposure, a photomask in contact with the photopolymer layer is no necessary, as the laser beam writes direct on to the layer. The high sensitivity of the compositions of the invention is very advantageous here and permits high writing speeds at relatively low intensities. This method can be used to make printed circuits for the electronics industry, lithographic offset plates or relief printing plates as well as photographic image recording materials.

The light-sensitive compositions may also contain sensitisers to increase the spectral sensitivity in a specific range of the electromagnetic spectrum.

Accordingly, the invention also relates to the use of the compositions as defined above as positive photoresists for the production of positive-working copying inks which are used typically for the production of printed circuits, discharge resists, offset printing plates, colour control sheets, stencils, name plates and the like.

EXAMPLES 1–3

Photoresist composition I (Example 1)

66.0% by weight of m-cresol/novolak resin ($M\overline{w}=90 000$)
25.0% by weight of esterification products of 1 part of 2,4,2',4'-tetrahydroxydiphenyl sulfide with 3 parts of naphthoquinone diazide-5-sulfonyl chloride
9.0% by weight of 2,3,4-trihydroxybenzophenone.
Photoresist composition II (Example 2)
65.9% by weight of m-cresol/novolak resin ($M\overline{w}=9000$)
25.0% by weight of the naphthoquinone diazide reaction product indicated in Example 1
9.0% by weight of 2,3,4-trihydroxybenzophenone
0.1% by weight of curcumine dye (q.v. EP-A 200 129).
Photoresist composition III (Example 3)
69.0% by weight of m-cresol/novolak resin ($M\overline{w}=9000$)
25.0% by weight of the naphthoquinone diazide reaction product indicated in Example 1
6.0% by weight of 2,3,4-trihydroxybenzophenone From these compositions 35% solutions in diethylene glycol dimethyl ether are prepared and filtered through 0.2 $\mu$m filters.

The photoresist solutions are spin-coated for 30 seconds on to silicon wafers of 100 mm diameter at 5000 rpm. The uniform layer thickness so obtained is 1.5 $\mu$m. The coated wafers are predried for 1 minute at 100° C. on a hot plate and exposed imagewise through a test wedge with monochromatic UV radiation at a wavelength of 436 nm with a wafer stepper (Canon FPA 1550, numerical aperture=0.35). The test pattern consists of lines and lattices of different dimensions from 3.0 $\mu$m to 0.5 $\mu$m.

The exposure energy is varied stepwise from 100-300 mJ/cm$^2$. The irradiated wafers are then given a post-exposure bake for 1 minute at 115° C., and then developed for 1 minute in a 2.4% aqueous solution of tetramethylammonium hydroxide.

The resultant resist layers are sputtered with gold and the 0.7, 0.8, 0.9 and 1.0 $\mu$m lattice structures are measured under an electron microscope and assessed.

The criteria for the evaluation are the quality (contrast) of the resist profile, the resolution and the change in line width of 1.0 $\mu$m resist lines at a 10% change in the exposure energy relative to the intensity which was necessary for the accurate reproduction of 1.0 $\mu$m lines.

The results are summarised in Table A below:

TABLE A

| Example | Resolution | Profile contrast | Variation in line width |
|---------|------------|------------------|-------------------------|
| 1 | 0.7 $\mu$m | good | 0.06 $\mu$m |
| 2 | 0.7 $\mu$m | good | 0.06 $\mu$m |
| 3 | 0.7 $\mu$m | good | 0.06 $\mu$m |

EXAMPLES 4 and 5

The following compositions are tested in similar manner:

Photoresist composition IV (Example 4)
68.0% by weight of m-cresol/novolak resin ($M\overline{w}=9000$)
22.0% by weight of the naphthoquinone diazide reaction product indicated in Example 1
10.0% by weight of 2,3,4-trihydroxybenzophenone.
Photoresist composition V (Example 5)
67.9% by weight of m-cresol/novolak resin ($M\overline{w}=9000$)
22.0% by weight of the naphthoquinone diazide reaction product indicated in Example 1
10.0% by weight of 2,3,4-trihydroxybenzophenone.

The results are summarised in Table B below:

TABLE B

| Example | Resolution | Profile contrast | Variation in line width |
|---------|------------|------------------|-------------------------|
| 4 | 0.8 $\mu$m | satisfactory | 0.09 $\mu$m |
| 5 | 0.8 $\mu$m | satisfactory | 1.00 $\mu$m |

These results indicate clearly that compositions which do not contain the compounds of formula I in the claimed amounts are markedly inferior to the photoresist compositions of the invention in respect of resolution, profile contrast and, in particular, also of fluctuations in line width.

What is claimed is:

1. A positive-working photoresist composition containing 23-27%, based on said composition, of at least one compound of formula (I)

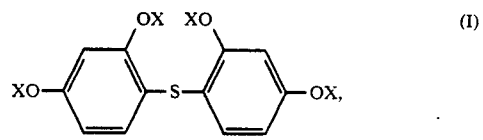

wherein one of the substituents X is hydrogen or a group of formula II

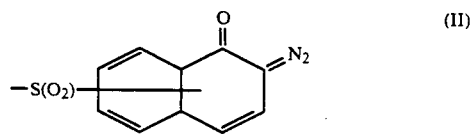

and the other substituents X are a group of formula II; and 6-11%, based on said composition, of at least one polyhydroxy compound of formula III

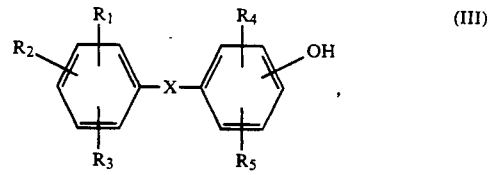

wherein X is a direct bond, —O—, —S—, —SO$_2$—, —CO— or C(R$_6$(R$_7$)—, and R$_1$, R$_2$, R$_3$, R$_4$ and R$_5$ are each independently of the other hydrogen, halogen, C$_1$-C$_4$alkyl, C$_1$-C$_4$alkoxy or hydroxy, and R$_6$ and R$_7$ are each independently of the other hydrogen, —CH$_3$ or —CF$_3$.

2. A composition according to claim 1, wherein one of the substituents X in formula I is hydrogen and the others are a group of formula II.

3. A composition according to claim 1, wherein the substituents X in formula I are a group of formula II.

4. A composition according to claim 1, wherein formula II has the structure

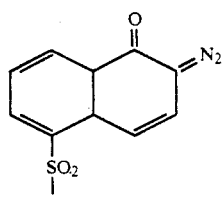

(II*)

5. A composition according to claim 1, wherein formula II has the structure

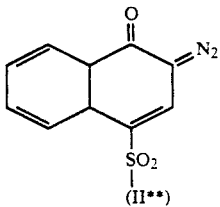

(II**)

6. A composition according to claim 1, wherein $R_1$, $R_2$, $R_3$, $R_4$ and $R_5$ are hydroxy.

7. A composition according to claim 6, which contains a trihydroxybenzophenone.

8. A composition according to claim 7, which contains 2,3,4-trihydroxybenzophenone.

9. A composition according to claim 1, wherein formula III has the structure

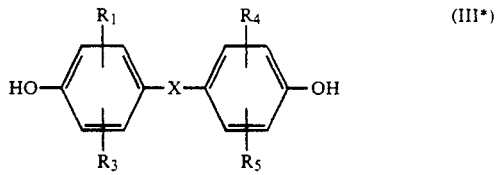

(III*)

10. A composition according to claim 1, which contains 50–71% by weight of a binder, based on said composition.

11. A composition according to claim 9, wherein the binder is a novolak resin.

12. A process for producing positive images comprising the following steps:
coating a substrate with a radiation-sensitive composition as defined in claim 1,
exposing the coated substrate to actinic radiation in a predetermined pattern, and
developing the exposed and coated substrate.

* * * * *